United States Patent [19]

Suzuki

[11] 4,080,619
[45] Mar. 21, 1978

[54] BIPOLAR TYPE SEMICONDUCTOR DEVICE

[75] Inventor: Kunizo Suzuki, Tokyo, Japan

[73] Assignee: Sony Corporation, Tokyo, Japan

[21] Appl. No.: 678,498

[22] Filed: Apr. 20, 1976

[30] Foreign Application Priority Data

Apr. 30, 1975    Japan .................................. 50-52733

[51] Int. Cl.² ......................................... H01L 29/72
[52] U.S. Cl. ........................................ 357/34; 357/52;
                                                    357/53; 357/54; 357/59
[58] Field of Search .................... 357/34, 53, 59, 54,
                                                    357/52

[56] References Cited

U.S. PATENT DOCUMENTS

| B535,209 | 3/1976 | Kajiwara et al. | 357/59 |
| 3,977,019 | 8/1976 | Matsushita et al. | 357/59 |
| 4,007,474 | 2/1977 | Yagi et al. | 357/34 |
| 4,014,037 | 3/1977 | Matsushita et al. | 357/54 |

FOREIGN PATENT DOCUMENTS 300,472    4/1968    Sweden ................................. 357/53

*Primary Examiner*—Stanley D. Miller, Jr.
*Assistant Examiner*—Joseph E. Clawson, Jr.
*Attorney, Agent, or Firm*—Hill, Gross, Simpson, Van Santen, Steadman, Chiara & Simpson

[57] ABSTRACT

A bipolar-type semiconductor device, such as a bipolar transistor, has a heavily doped emitter region, a lightly doped emitter region, a base region, a collector region and a passivation layer or layers on said regions. The passivation layer formed on a surface end of a PN junction between the collector region and the base region is a polycrystalline silicon containing oxygen atoms in a range between 14 and 35 atomic percents. The other passivation layer formed on a surface end of the other PN junction between the base region and the lightly doped emitter region is made of silicon-dioxide, which covers also a surface end of lightly doped and heavily doped (LH) junction between two emitter regions.

3 Claims, 13 Drawing Figures

BIPOLAR TYPE SEMICONDUCTOR DEVICE

BACKGROUND OF THE INVENTION

1. Field of the Invention

The present invention relates mainly to a bipolar type semiconductor device, and more particularly to a surface passivation for a bipolar transistor having an emitter region in which a diffusion length of minority carriers is designed relatively larger than the thickness of the emitter region.

2. Prior Art of the Invention

In a prior art bipolar transistor, a base region is formed by a selective diffusion into a collector region and an emitter is formed by a second diffusion into the base region with sufficiently high impurity concentration. In such a double diffused type or heavily doped emitter type transistor, an emitter-grounded current amplification factor $h_{FE}$ is increased by the heavy doping of impurities in the emitter resulting a high emitter efficiency. However, such a transistor is apt to include lattice dislocation in the emitter region because of the heavy doping in the degree of $10^{19} \sim 10^{20}$ atoms $\cdot$ cm$^{-3}$ or more. Further, an insufficient crystal characteristics at the emitter-base junction and a small diffusion length of carriers cause a limitation for the increase of the $h_{FE}$.

In order to improve the bipolar transistor, a low impurity concentration emitter type transistor was proposed, in which the emitter has a lightly doped emitter region. This transistor is fabricated, for example, by the following steps. First of all, an N type silicon substrate doped with relatively high impurities is prepared. An N type silicon layer doped with relatively low impurities is formed on the silicon substrate by the epitaxial grown technique. This silicon layer becomes a collector region of the transistor. A P type base region is selectively diffused and formed in the N type epitaxial collector region by the ion-implantation or the conventional diffusion technique. A second epitaxially grown layer of N type is formed on the surface of the base region and the remaining surface portion of the collector region. Then, an insulating layer, such as silicon dioxide (SiO$_2$) is thermally grown on the second epitaxially grown layer. A P type ring-shaped region for the base contact is formed by the selective diffusion penetrating through the second epitaxial layer and reaching the base region, and a heavily doped emitter region of N type is formed by another diffusion into the second N type epitaxial layer so that the heavily doped emitter region is surrounded by the ring-shaped P type region. Finally, electrodes are formed. In this case a surface of portion of semiconductor regions especially surface ends of PN junctions are covered by the insulating layer.

Since the insulating layer sandwiched between the semiconductor layer and incidentally induced electric charges upon the insulating layer constructs a capacitive element, the surface of the semiconductor region is apt to be affected by the external electric field caused by fixed ions in the insulating layer or by the polarization of the region molding the semiconductor device.

In order to avoid such an affection or phenomenon, the other passivation layer of a polycrystalline silicon layer having high resistivity may be considered in stead of the silicon dioxide layer. However, the polycrystalline silicon passivation layer causes the increase of leakage current through the layer because of its lower resistivity than that of the silicon dioxide. Moreover, if the polycrystalline silicon layer is formed on the surface of the lightly doped emitter region of the above mentioned bipolar transistor, the emitter grounded current amplification factor $h_{FE}$ is decreased, since minority carriers injected from the base region into the lightly doped emitter region reach and recombine at the interface between the polycrystalline silicon and the emitter region.

SUMMARY OF THE INVENTION

It is, therefore, one object of this invention to provide an improved semiconductor device, particularly a bipolar-type semiconductor device including an emitter region lightly doped with impurities therein, in which the reliability of the device is improved.

It is another object of this invention to provide a bipolar-type semiconductor device in which the break down voltage of the reversely biased PN junction, such as the collector-base junction, is improved and enhanced.

It is further object of this invention to provide a bipolar-type semiconductor device in which the emitter grounded current amplification factor $h_{FE}$ thereof is enhanced.

Figure 1:
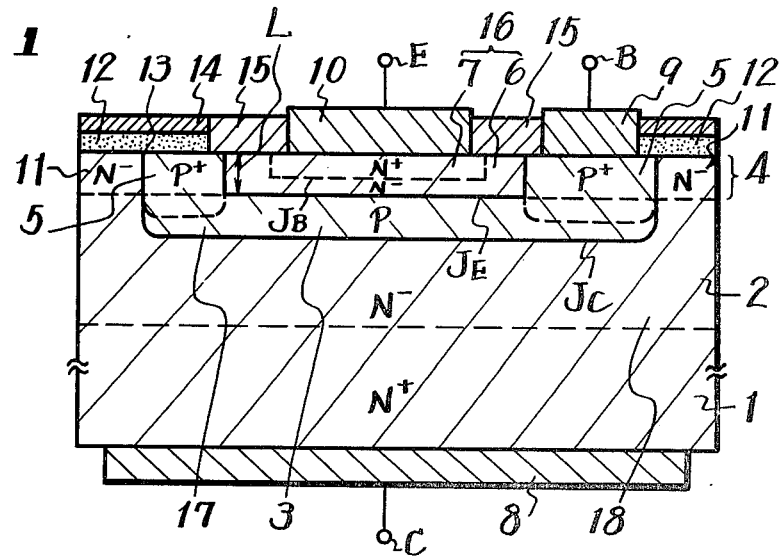
FIG. 1 is an enlarged cross-sectional view showing an embodiment of the bipolar transistor according to the present invention.

FIGS. from 2 to 7 are also enlarged cross-sectional views showing fabricating steps of the embodiment of the present invention shown in FIG. 1.

FIGS. from 8 to 11 are also enlarged cross-sectional views showing other steps for fabricating the embodiment of the present invention.

Figure 12:
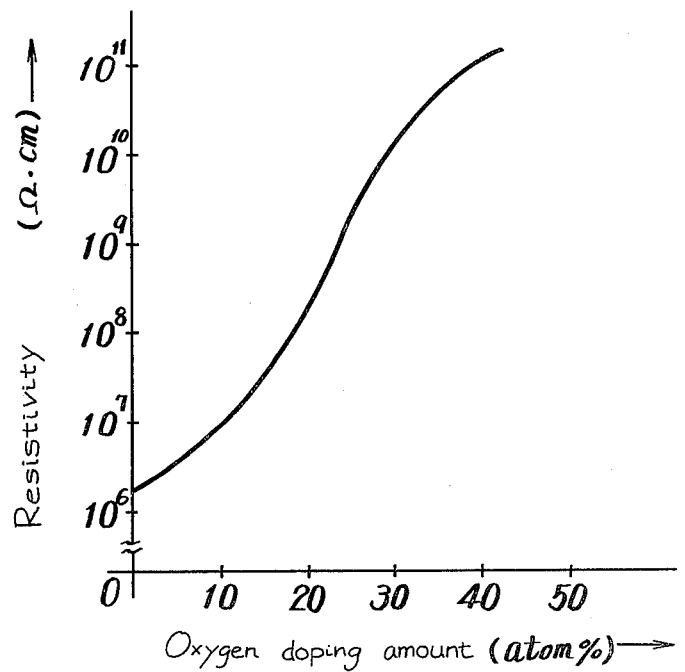

FIG. 12 is a graph showing a measured curve of resistivity with respect to oxygen doping amount in a polycrystalline layer, which is used for explaining this invention.

Figure 13:
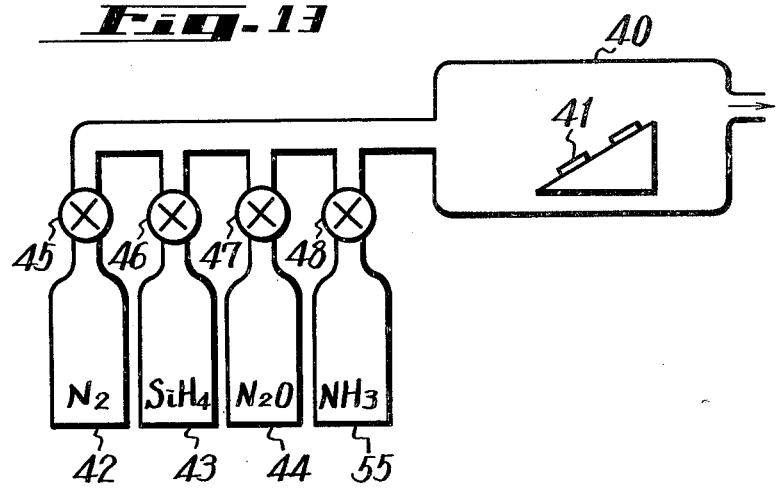

FIG. 13 is a schematic view used for explaining the fabricating operation of a polycrystalline silicon layer.

DESCRIPTION OF THE PREFERRED EMBODIMENTS

Referring now to FIG. 1, there is shown an example of the bipolar transistor according to the present invention. The bipolar transistor, in this case, is an NPN type silicon transistor consisting of an original substrate 1 of heavily doped N type silicon, a lightly doped N type region 2 epitaxially grown on the original substrate 1 and a P type base region 3 selectively formed on the N type region 2, an N type epitaxial layer 4 deposited on the region 2 and the base 3, a substantially ring-shaped base contact region 5, a lightly doped N type emitter region 6 surrounded by the base contact region 5 and the base region 3, a heavily doped N type emitter region 7 diffused in the lightly doped emitter 6, and electrodes 8, 9, 10 for the collector, base and emitter respectively. In this case, the heavily doped emitter region 7 of N type is formed in the lightly doped emitter region 6 of N type, in which the distance between the heavily doped emitter region 7 and the base region 3 is selected smaller than the diffusion length of minority carriers in the lightly doped region 6. The heavily doped region 7 forms an electric barrier $J_B$ consisting of an LH(lightly doped and heavily doped) junction at the interface of both regions 6 and 7. In other words, the distance between the electric barrier $J_B$ (or the LH junction) and an emitter-base junction $J_E$ is selected smaller than the above mentioned diffusion length of minority carriers in the lightly doped emitter region 6.

Furthermore, in the case of this transistor, the epitaxial layer 4 of N type is grown and formed with a good crystallographical property so that the diffusion length of minority carriers in this layer 4 is sufficiently larger than the thickness of the layer 4 or than the distance L between the emitter-base junction $J_B$ and the surface of the layer 4. Using the present epitaxial growth technology, it may be easy to obtain the layer 4 having the diffusion length of minority carriers larger than 50 $\mu$m. It should be noted that minority carriers injected from the base region 3 into the highly doped emitter 6 reach the surface portion of the lightly doped emitter 6 when the emitter-base junction $J_E$ is forwardly biased.

A peripheral part 11 of the N type epitaxial layer 4, outside of the base contact region 5, is connected with the first epitaxial layer 2 and forms a collector region together with the N type region 2 and the original substrate 1. As a result, a collector-base junction $J_C$ is a PN junction formed between P type regions 3 and 5 and N type regions 2 and 12. When the collector-base junction $J_C$ is reversely biased, a depletion layer extends from the junction $J_C$ toward not only the N type region 2 but the peripheral part 11 of the N type epitaxial layer 4.

In the present invention, a polycrystalline silicon layer 12 containing oxygen atoms is deposited on a surface of the N type peripheral part 11 in the layer 4 and on a part of the P type base contact region 5. As a result, the oxygen-doped polycrystalline silicon layer 12 covers a surface end 13 of the collector-base junction $J_C$. The layer 12 is covered by a second layer 14 of a nitrogen-doped polycrystalline silicon or an insulating material in order to be of proof against the moisture and to make good the resistance between electrodes in the case of the integrated circuit.

Since the N type epitaxial layer 4 is divided by the P type ring-shaped base contact region 5 into the peripheral part 11 and the central part which is the lightly doped emitter 6, the emitter-base junction $J_E$ is the PN junction formed between P type regions 3 and 5 and the N type emitter region 6. An insulating layer 15, such as silicon dioxide ($SiO_2$) is located on a part of the surface of the base contact region 5, the surface of the lightly doped emitter region 6 and a part of the surface of the heavily doped emitter region 7. Thus it also covers the surface end of the emitter-base junction $J_E$ and the surface end of the barrier $J_B$ i.e. the LH junction in the emitter. The surface of the lightly doped emitter 6 is the surface part where the heavily doped emitter 7 is not located. The insulating layer 15 is located at the distance from the emitter-base junction $J_E$, especially from the upper end of the buried base region 3, within the diffusion length of minority carriers in the lightly doped emitter 6, i.e. the hole diffusion length in the case of the NPN transistor. In the present invention, a total emitter region 16 has the lightly doped emitter 6 and heavily doped emitter 7, a total base region 17 has the buried base 3 and the base contact region 5, and a total collector region 18 has the original substrate 1, the epitaxial layer 2 and the peripheral part 11 of the second epitaxial layer 4. The material of the insulating layer 15 is selected so that the surface recombination velocity (S-1) at the interface of the emitter 6 and the insulating layer 15 is smaller than the other surface recombination velocity (S-2) at the interface of the collector region 11 in the epitaxial silicon layer 4 and the passivation layer 12 thereon. The surface recombination velocity (S-1) at the interface between the epitaxial silicon layer and the thermal grown silicon-dioxide ($SiO_2$) is approximately 20 cm/sec or less. The other surface recombination (S-2) at the interface between the epitaxial silicon layer and the polycrystalline silicon containing oxygen atoms about 20 atomic percents is approximately 100 cm/sec.

Referring to FIGS. from 2 to 7, a fabrication method for the semiconductor device according to the present invention a first embodiment will be described in the order of the fabricating steps. In the case of this example, the semiconductor device has a semiconductor guard ring or a field limiting ring surrounding the collector-base junction $J_C$ which is well known in the transistor having the high break down property.

Figure 2:
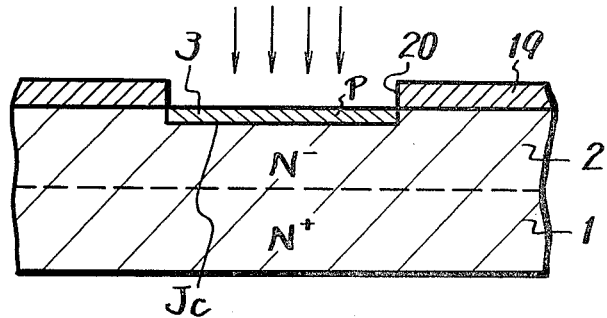

First of all, as shown in FIG. 2, a mono-crystalline silicon original substrate 1 is prepared, which is heavily doped with N type impurities such as phosphorus in the concentration about $10^{20}$ atoms·cm$^{-3}$. After an epitaxial growth of an N type layer 2 which is relatively lightly doped with impurities and has a thickness about 10 $\mu$m, on a surface of the original substrate 1, a masking layer 19 of silicon dioxide ($SiO_2$) having a sufficient thickness for masking is deposited on a surface of the first epitaxial layer 2. After forming an opening 20 in the masking layer 19 by the well known photo etching process, P type impurities, such as boron atoms, are selectively diffused or ion-implanted through the opening 20 into the first epitaxial layer 2 resulting a buried base region 3 having an impurity concentration in the order of $10^{17}$ atoms·cm$^{-3}$ and having a depth about 2 $\mu$m. The first epitaxial layer 2 and the buried base region 3 of opposite conductivity types each other form a bottom part of the collector-base junction $J_C$.

Figure 3:
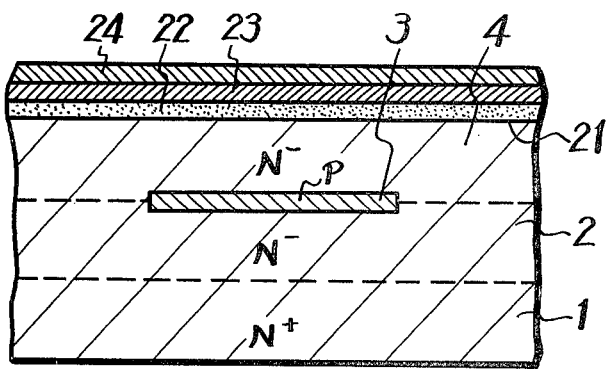

FIG. 3 shows a further step. After removing the masking layer 19, a second epitaxial silicon layer 4 is formed on the first epitaxial layer 2 and the buried base region 3. The second epitaxial layer 4 may have the impurity concentration about $5 \times 10^{15}$ atoms·cm$^{-3}$ and the thickness about 5 $\mu$m. This layer 4 has to be grown in a good crystalline property so that the diffusion length of minority carriers in this layer is in the range from 50 to 100 $\mu$m. Then, on a surface 21 of this layer 4, a first layer 22 of polycrystalline silicon containing oxygen atoms, a second layer f23 of polycrystalline silicon containing nitrogen atoms and a third layer 24 of polycrystalline silicon containing oxygen atoms are deposited by the chemical vapour deposition (CVD) technique successively. The CVD method used in this process is explained later with reference to FIG. 13.

After forming openings in the third layer 24 by the photo-etching with an etchant in which the hydrogen fluoride, acetic acid and nitric acid are mixed, the second layer 23 is selectively etched with the phosphoric acid using the opened third layer 24 as an etching mask. Then, the first layer 22 is also etched with the same etchant as used for the third layer 24 using the opened second layer 23 as an etching mask. Since the third layer 24 is also etched and removed, two layers 23 and 22 with openings are formed.

Figure 4:
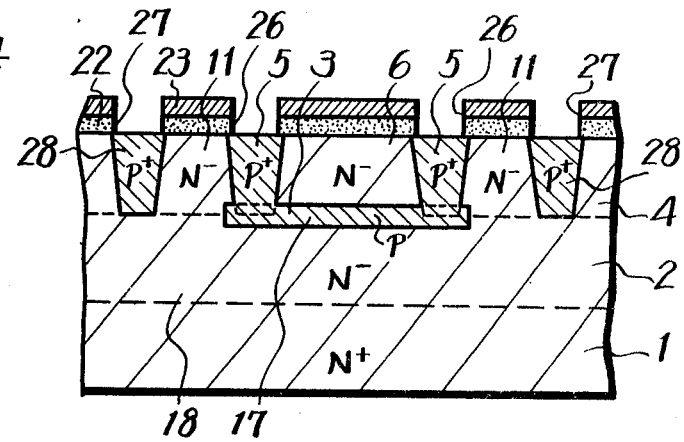

As shown in FIG. 4, one of openings 26 through the layers 23 and 22 is formed in ring shape and the other opening 27 is also formed in larger ring shape surrounding the opening 26. P type impurities are diffused through openings 26 and 27 into the second epitaxial layer 4, and two regions 5 and 28 of P type are formed having the impurity concentration about $10^{19}$ atoms·cm$^{-3}$. The inner region 5 is a base contact region dividing the second epitaxial layer 4 into two regions i.e. a lightly doped emitter region 6 at the center and a peripheral collector region 11. A side portion of the collector-base junction $J_C$ is then formed between the region 5 and region 11. The depth of the base contact region 5 is selected as approximately the thickness of the second epitaxial layer 4 contacting the buried base region 3 forming the total base region 17. The outer ring shaped region 28 is a guard ring or field limiting ring. The remaining portion of N type layers forms the total collector region 18.

Figure 5:
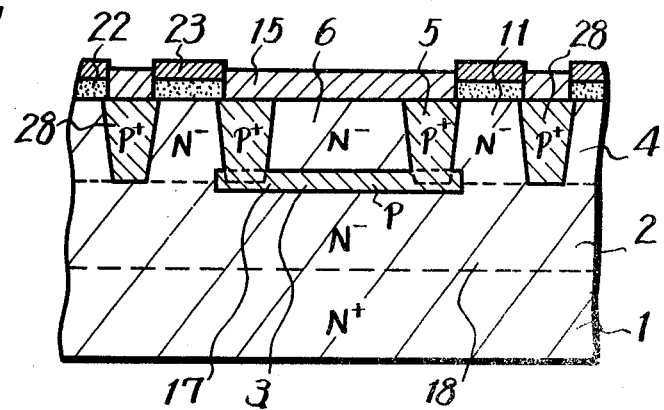

FIG. 5 shows a next step where a portion of the layers 22 and 23 surrounded by the opening 26 is selectively removed and then a new insulating layer 15 of silicon dioxide ($SiO_2$) is formed by the well known thermal oxidation of silicon. At the same time, the other thermal oxide of silicon is formed on the P type ring region 28 in the opening 27. Thickness of the oxide 15 is about 5000 A so that is can be used as a diffusion mask in a following step.

Figure 6:
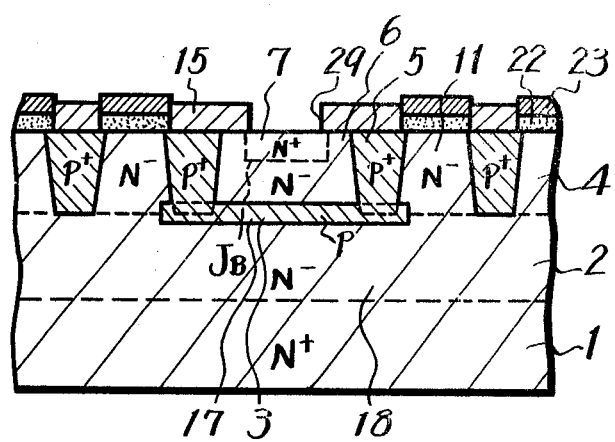

After forming an opening 29 at the center of the insulating layer 15 by the photo-etching, as shown in FIG. 6, a heavily doped N type emitter region 7 is formed by the diffusion through the opening 29. The region 7 has the impurity concentration about $10^{20}$ atoms·cm$^{-3}$ which is sufficiently high to make an electric barrier $J_B$ of LH junction with the lightly doped emitter region 6. The impurity concentration and the doping profile of this region 7 is selected so that a built-infield E is higher than the value $(k·T)/q·L_p)$, where $k$ is the Bolzman's constant, T is the absolute temperature, $q$ is the electric charge of electron and $L_p$ is the diffusion length of minority carriers in the lightly doped emitter 5.

Figure 7:
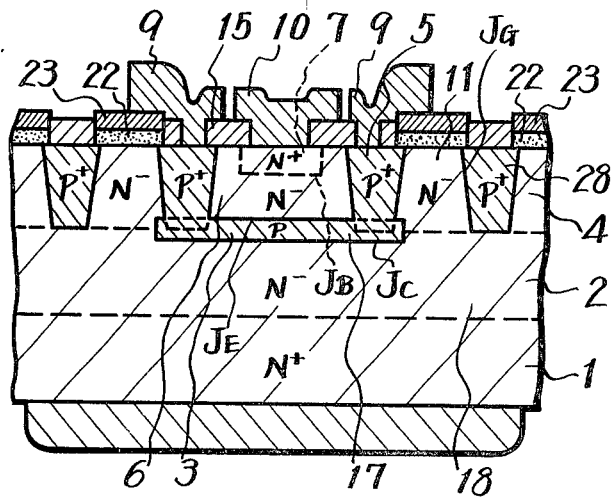

FIG. 7 shows the last step of the first fabrication embodiment of the present invention in which an electrode 10 for the emitter, an electrode 9 for the base and an electrode 8 for the collector are formed contacting with each of semiconductor regions, respectively.

In accordance with the first embodiment of the fabrication for the semiconductor device of this invention as mentioned above, the polycrystalline silicon layer 22 containing oxygen atoms is located on the surface of semiconductor layer 4 covering especially the surface end of the collector base junction $J_C$ formed between the collector 18 and the base 17. This passivation layer 22 covers whole of surface end of the junction $J_C$. The passivation layer 22 also covers a surface of a part of collector 11 and a surface end of the other PN junction $J_G$ formed between a part of the collector 11 and the guard ring 28.

Further, the second passivation layer 33 of the nitrogen-doped polycrystalline silicon is located at the top surface of the first passivation layer 22 of the oxygen-doped polycrystalline silicon.

The bipolar transistor of the present invention fabricated by the above mentioned first fabrication method has the further passivation layer 15 of the insulating material, such as silicon dioxide ($SiO_2$). The third passivation layer 15 covers whole of the surface portion of the lightly doped emitter region 6, a part of the base contact region 5 and a part of the heavily doped emitter region 7, respectively. The emitter electrode connected with the region 7 extends on the silicon dioxide layer 15 toward the base electrode 9 and indirectly covers the whole of surface end of the LH junction $J_B$, by which the reliability of the device is increased even under a cruel condition. The base electrode 9 connected to the base contact region 5 also extends on the silicon dioxide layer 15 toward the emitter electrode 10 and indirectly covers the whole of surface end of the emitter-base junction $J_E$, by which the reliability of the device is also increased. Since the layer 22 of polycrystalline silicon containing oxygen atoms does not cover the surface of the lightly doped emitter 6, the emitter grounded current amplification factor $h_{FE}$ of the transistor is very high because of the low recombination velocity (S-1) which is already mentioned.

Figure 8:
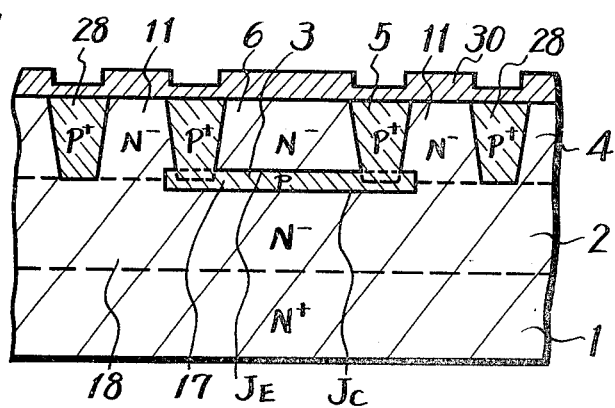

Referring to FIGS. from 8 to 11, another fabrication method for the semiconductor device of the present invention will be described as a second embodiment. FIG. 8 shows an intermediate step of this method where a first epitaxial layer 2 of N type silicon is formed on an original substrate 1; a buried base region 3 of P type is formed by the similar method explained with FIG. 2; a second epitaxial layer 4 of N type silicon is formed on the first epitaxial layer 2 and on the buried base region 3; a masking layer 30 of an insulating material, such as silicon dioxide ($SiO_2$) is formed on the second epitaxial layer 4; and two ring-shaped regions 5 and 28 of P type are formed by the diffusion through openings formed in the masking layer 30 into the N type silicon layer 4. During the diffusion, a new oxide layer is formed on the diffused regions 5 and 28.

Conditions of each semiconductor region, for example, impurity concentrations, thicknesses of layers, and depths of diffused regions are substantially same as the first embodiment. Since the P type base contact region 5 is a ring-shaped region diffused through the N type silicon layer 4 reaching the buried base region 3, the N type epitaxial silicon layer 4 is a divided into a central part which is a lightly doped emitter region 6 and a peripheral part 11 which is a part of the collector 18. The ring-shaped base contact region 5 and the buried base region 3 form a total base region 17. A collector-base junction $J_C$ is formed between the collector region 18 and the base region 17. An emitter-base junction $J_E$ is formed between the lightly doped emitter region 6 and the base region 17.

Figure 9:
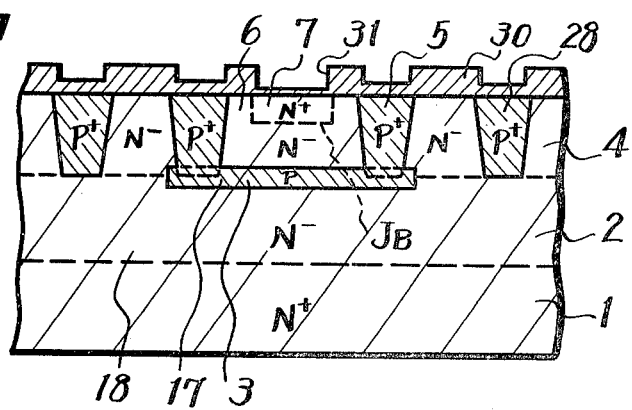

FIG. 9 shows a further step in which a heavily doped emitter region 7 is formed by the selective diffusion method with N type impurities through an opening 31 formed in a central part of the masking layer 30. In the case that the second epitaxial layer 4 has the thickness of 5 μm, the heavily doped emitter 7 is formed in the depth of about 2 μm. An LH junction $J_B$ with an electric barrier is formed between the lightly doped emitter 6 and the heavily doped emitter 7. The LH junction $J_B$ has a surface end beneath the masking layer 30 of silicon dioxide ($SiO_2$). During the diffusion, a new silicon dioxide ($SiO_2$) layer is formed by the thermal growth on the diffused region 7 and connects the masking layer 30. As a result, the whole of the surface portion of the lightly doped emitter region 6, the surface end of the LH junction $J_B$ and the surface end of the emitter-base junction $J_E$ are beneath the insulating layer 30 of silicon dioxide $SiO_2$. The insulating layer 30 is located apart from the junction $J_E$ or from the buried base 3 within the distance smaller than the diffusion length of minority carriers in the lightly doped emitter 6.

Figure 10:
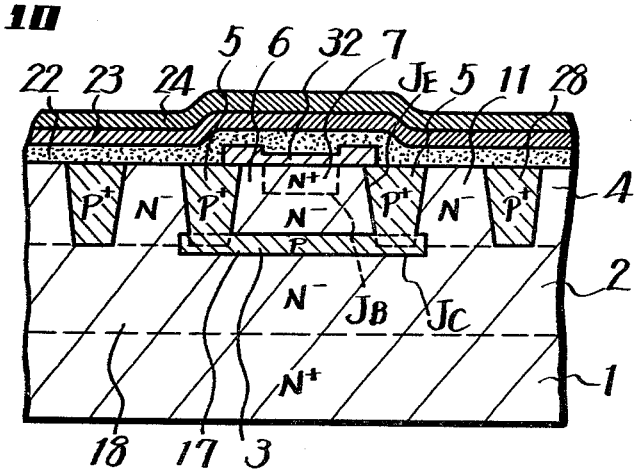

FIG. 10 shows a further step where passivation layers are formed on the collector base junction $J_C$, on the guard ring 28 and on the surface part of the collector 11. Before depositing such layers, the masking layer 30 shown in FIG. 9 is selectively etched off by the photo-etching technique with a photo-resist mask (not shown in the drawing) covering a part of the silicon dioxide layer 30 which is on the heavily doped emitter region 7, on the lightly doped emitter region 6 and on a part of the base region 5. A remaining silicon dioxide layer, after such a selective removal, is shown in FIG. 10 with a numeral 32. Removing the photo-resist mask, three passivation layers 22, 23 and 24 are deposited by the chemical vapour deposition (CVD) technique covering whole area of the upper surface of each region and of the insulating layer 32 as shown in FIG. 10. The first layer 22 is an oxygen-doped polycrystalline silicon layer, the second layer 23 is a nitrogen-doped polycrystalline silicon layer and the third layer 24 is also an oxygen-doped polycrystalline silicon layer, which are substantially same as the layers explained with FIG. 3. The CVD technique used here is explained later with FIG. 13.

Figure 11:
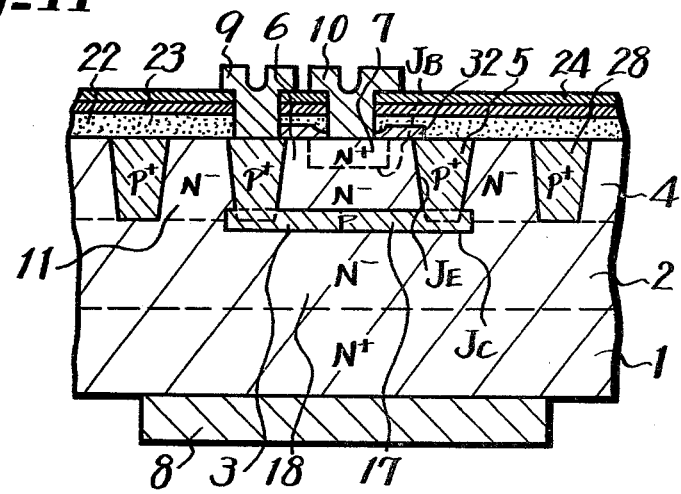

FIG. 11 shows a final step of the second fabrication method of this invention where electrodes 9 and 10 for the base region and emitter region respectively are formed to make ohmic contacts with these semiconductor regions. Before the deposition process of electrodes, openings are formed in the layers 22, 23 and 24 by the etching as explained in the first fabrication method with FIG. 7. In the case that the third layer 24 is covered by the mask during the etching, the layer 24 may remain on the nitrogen-doped polycrystalline silicon layer 23 as shown in the FIG. 11. In stead of oxygen-doped polycrystalline silicon layer, the third layer 24 may be the insulating layer made of, such as silicon dioxide ($SiO_2$) or silicon nitride ($Si_3N_4$). Electrodes 9 and 10 may be a metal layer made of, such as alluminum. On the bottom surface of the substrate 1, a collector electrode is provided.

In accordance with this second fabrication method, almost similar biporlar transistor is obtained, excpet that the first passivation layer 23 of oxygen-doped polycrystalline silicon layer extends not only on the surface end of the collector-base junction $J_C$, a part of collector region 11 and on the guard ring region 28 of P type silicon but also extends on the remaining insulating layer 32 which covers the LH junction $J_B$, the surface end of the emitter-base junction $J_E$ and the surface portion of the lightly doped emitter region 6. Such a structure causes the advantages in the stabilization and the reliability of the device since the oxygen-doped polycrystalline silicon layer 22 has an effect to relieve the external field effect by electric charges which accidentally appears adjacent the device.

As described above, in accordance with the present invention, the oxygen doped polycrystalline silicon layers 22 is used for the passivation at the collector side surface of the device. The thickness of this layer 22 is selected in the range from 1000 to 10000 A, for example 5000 A in the above embodiments. The thickness of the second passivation layer 23 of nitrogen-doped polycrystalline layer is thicker than 1000 A, for example, 1500 A.

The relationship between the oxygen doping amount and the resistivity of the layer 23 is obtained and shown in FIG. 12, which indicates that the resistivity increases according to the increase of the oxygen doping amount. This is an experimental result in the case that the mean value of grain size of polycrystalline silicon is approximately 200~300 A.

It is clear that the higher amount of oxygen doped in the polycrystalline causes higher resistivity and less leakage current through the oxygen-doped polycrystalline layer 22, however it causes disadvantage observed in the case of silicon dioxide passivation, which is described in the outset. From the experimental consideration, the preferable range of oxygen doping amount in the polycrystalline silicon is from 14 to 35 atom % in order to obtain the passivation for the collector-base junction $J_C$ resulting to increase the break down voltage of the junction. The above range corresponds to the resistivity range approximately $10^7$ to $10^{10} \Omega \cdot cm$, which may be called a semi-insulating property. In the case of the first fabrication method in which the high temperature treatment, such as diffusion process, exists after the depossition of this oxygen-doped polycrystalline silicon layer, the oxygen doping amount is selected not lower than 20 atom % to avoid a post-diffusion of impurities from silicon regions to the polycrystalline silicon layer.

Further, the mean value of grain size of the polycrystalline silicon is preferably selected smaller than 1000 A. From the practical point of view in the CVD technique, the range larger than 50 A is preferable for the growth speed of the layer. In the case of the grain size larger than 1000 A, the leak current through the polycrystalline silicon is apt to be increased in the device operation.

As to the nitrogen-doped polycrystalline silicon layer 23, the nitrogen doping amount is preferably selected higher than 10 atom %. This layer 23 shows a similar property as a silicon nitride ($Si_3N_4$) in the case of higher amount of nitrogen doping, and the silicon nitride layer is replaced in stead of the nitrogen-doped polycrystalline silicon. In order to etch these layers 22 and 23, the plasma etching method may be used in stead of the above mentioned chemical etching period. The plasma etching method uses acceralated ionized charges for the bombardment.

Now, the chemical vapor deposition (CVD) technique is explained with FIG. 13, by which the oxygen-doped or nitrogen-doped polycrystalline silicon layers are formed on the semiconductor layer. In the case of the deposition of the oxygen-doped polycrystalline silicon layer 22 of FIG. 3 and 10, a reacting furnace 40 including the semiconductor substrate 41 wherein predetermined regions are already formed, is connected to a carrier gas supply source 42 from which nitrogen gas ($N_2$) flows into the furnace 40, connected to a silicon supply source 43 from which mono-silane ($SiH_4$) flows, and connected to an oxygen supply source 44 from which dinitrogen monoxide ($N_2O$) flows, respectively. The semiconductor substrate 41 on which the polycrystalline silicon is deposited, is heated at the temperature in the range from 600° to 750° C, preferably at 650° C. Reaction of mono-silane ($SiH_4$) with dinitrogen monoxide ($N_2O$) causes the oxygen-doped polycrystalline silicon layer 22 on the surface of the silicon substrate 41.

The monosilane ($SiH_4$) is preferable for the silicon supply source than the silicon tetra-chloride ($SiCl_4$), since the silicon tetra-chloride requires a reaction temperature as high as 900° C which causes large grain size of polycrystalline silicon and resulting in large leak current through the layer. In stead of $N_2O$ gas, as the oxygen supply source, nitric oxide (NO) or nitrogen dioxygen ($NO_2$) may be used because the controlability of the oxygen doping amount is very easy. On the contrary, in the case of using steam ($H_2O$) or pure oxygen gas ($O_2$), the oxygen doping amount is not easy to control since the reacting speed with silane is quite high.

The reason why the temperature of the silicon substrate 41 in the reacting furnace 40 is selected in the range from 600° to 750° C, is that, in the case of temperature lower than 600° C, the growth speed of the polycrystalline silicon is too slow for the practical device production, and in the case of temperature higher than 750° C, the growth speed is too high to control the thickness of the polycrystalline silicon layer and further the grain size of the polycrystalline silicon is apt to be too large.

As shown in both embodiments, the nitrogen-doped polycrystalline silicon layer 23 is continuously deposited on the surface of the oxygen-doped polycrystalline silicon layer 23. By the change of gases from $N_2O$ to ammonia ($NH_3$) which is supplied from a $NH_3$ supply source 55, the depositing layer is changed from the oxygen-doped polycrystalline silicon to the nitrogen-doped polycrystalline silicon. Such a change of gases and the control of gas flow rate is achieved by controllers 45, 46, 47 and 48 shown in FIG. 13.

In accordance with the present invention, the high break down voltage property is obtained, since the surface of the collector-base junction $J_C$ which is reversely biased in the operation, is covered by the semi-insulating layer 12, 22, such as the oxygen-doped polycrystalline silicon layer. Besides, the high emitter grounded amplification factor $h_{FE}$ is obtained, since the surface of the lightly doped emitter 6 and junctions $J_B$ and $J_E$ are covered by the insulating layer 15, 32, such as a silicon dioxide layer which has a lower surface recombination velocity at the interface with the silicon layer 4.

In accordance with the invention, the bipolar type semiconductor device is stabilized by the semi-insulating layer, since the semi-insulating layer 22 causes the relief of the affection of the external electric field. Especially, in the case of the second fabrication method shown in FIGS. 8 to 11, such an advantage is increased since the semi-insulating layer 22 is located not only on the surface of the collector-base junction $J_C$ but also on the insulating layer 15 covering the surface of the lightly doped emitter 6 and junctions $J_E$ and $J_B$.

While the present invention has been explained in detail, it is to be understood that modifications, variations and changes may be made to the described embodiments, for example the present invention may be used in a PNP type transistor.

I claim as my invention:

1. A bipolar type semiconductor device comprising:
   (a) a collector region of one conductivity type;
   (b) a base region of the other conductivity type forming a collector-base junction with said collector region;
   (c) a lightly doped emitter region of said one conductivity type forming an emitter-base junction with said base region;
   (d) a heavily doped emitter region of said one conductivity type forming an electric barrier with said lightly doped emitter region;
   (e) a semi-insulating layer formed directly on a surface end of said collector-base junction, said semi-insulating layer having a resistivity between $10^7$ and $10^{10}$ ohm-cm.;
   (f) an insulating layer formed on a surface of said lightly doped emitter, on a surface end of said emitter-base junction and on a surface end of said electric barrier; and
   (g) electrodes for said emitter, base and collector;
   (h) said semi-insulating layer also extending on a surface of said insulating layer covering said lightly doped emitter region.

2. A bipolar type semiconductor device according to claim 1, in which said semi-insulating layer is a polycrystalline silicon layer containing of oxygen atoms in a range between 14 and 35 atomic percents and said insulating layer is a silicon dioxide layer.

3. A bipolar type semiconductor device according to claim 1, in which said insulating layer has a surface recombination velocity at the surface of said lightly doped region lower than that of said semi-insulating layer at the surface of said collector region.

* * * * *